United States Patent
Yamaguchi

[11] Patent Number: 5,841,717
[45] Date of Patent: Nov. 24, 1998

[54] SEMICONDUCTOR MEMORY DEVICE FACILITATING USE OF A HIGH FREQUENCY CLOCK SIGNAL

[75] Inventor: Shusaku Yamaguchi, Kawasaki, Japan

[73] Assignee: Fujitsu Limited, Kawasaki, Japan

[21] Appl. No.: 857,173

[22] Filed: May 15, 1997

[30] Foreign Application Priority Data

Dec. 17, 1996 [JP] Japan ................................... 8-337204

[51] Int. Cl.[6] .................. G11C 7/00; G11C 7/02
[52] U.S. Cl. .................. 365/205; 365/207; 365/208; 365/194; 365/203
[58] Field of Search .................. 365/205, 207, 365/208, 189.05, 194, 230.06, 230.08, 149, 203

[56] References Cited

U.S. PATENT DOCUMENTS 5,553,024  9/1996  Furuyama ........................ 365/189.05
5,559,752  9/1996  Stephen, Jr. et al. ..................... 365/194
5,590,080  12/1996  Hasagawa et al. ...................... 365/205

*Primary Examiner*—David C. Nelms
*Assistant Examiner*—Trong Phan
*Attorney, Agent, or Firm*—Nikaido, Marmelstein, Murray & Oram LLP

[57] ABSTRACT

A semiconductor memory device includes gates which open in a data-write operation and a data-read operation to allow a passage of data therethrough, and a control circuit changing an open period of the gates between the data-write operation and the data-read operation.

12 Claims, 9 Drawing Sheets

SEMICONDUCTOR MEMORY DEVICE FACILITATING USE OF A HIGH FREQUENCY CLOCK SIGNAL

BACKGROUND OF THE INVENTION

1. Field of the Invention

The present invention generally relates to semiconductor devices, and particularly relates to a semiconductor device in which a data-read operation and a data-write operation with respect to sense amplifiers thereof is controlled by internally generated pulses.

2. Description of the Related Art

Semiconductor memory devices such as DRAMs (dynamic random access memories) and SDRAMs (synchronous DRAMs) carry out data-read operations and data-write operations with respect to memory cells via sense amplifiers.

In the case of data-read operations, a selection of a word-selection line reads data from selected memory cells to bit lines, and data on the bit lines is amplified by sense amplifiers. The amplified data is selected and transferred to a data bus by opening column gates selected by column-selection lines.

In the case of the data-write operation, a selection of column-selection lines opens selected column gates so as to transfer data on the data bus to sense amplifiers. The data stored in the sense amplifier is transferred via bit lines and written in memory cells selected by a word-selection line.

A pair of bit lines and a pair of data-bus lines are provided for one bit of data. Two lines of each of these pairs are charged (pre-charged) to a predetermined voltage level and are short-circuited (equalized) with each other so as to have the same voltage level prior to data transfer. Data is transferred as a voltage difference between the precharged and equalized two lines so as to achieve a high-speed data transfer.

The precharging operation and the equalizing operation are simultaneously carried out, and there is a need to complete these operations before data to be transferred is provided to the signal lines. When consecutive data-read operations (or consecutive data-write operations) are performed, the precharging and equalizing of bit lines and data bus should be finished in a short time period between an end of a given data-read operation and the start of the next data-read operation.

Because of such requirement, the precharging operation and equalizing operation should be completed in the remaining time period of a one-clock cycle after a given data-read operation or a given data-write operation is finished.

In the context of data-read/write operations via column gates between a data bus and sense amplifiers, the data-read/write operations are equivalent to opening (turning on) of selected column gates. Column gates are comprised of transistors, and are opened when the transistors are turned on by pulse inputs applied to gates of the transistors. While column gates are open, the data-read/write operations are performed. Therefore, one cycle of a clock should be divided into two periods, one period for applying pulse inputs to column-gate transistors and the other period for a precharging and equalizing operation.

In data-write operations, new data has to overwrite old data in the sense amplifiers, so that a voltage of a large amplitude needs to be applied to the data bus. When a voltage of a large amplitude is given to the data bus, however, an equalizing operation for the next cycle requires a long time before completion thereof. This is because the large voltage difference between a pair of signal lines has to be brought back to zero so that the signal lines have the same voltage level. Because of the lengthy equalizing operation, a pulse length for performing a data-write operation should be limited to a relatively short length.

Data-read operations are conducted while amplifying a small-amplitude voltage on the data bus by using a read amplifier. Because of use of the read amplifier, a relatively small voltage amplitude on the data bus is sufficient for the purpose of data-read operations. The equalizing of the data bus in this case does not take a long time. Since data is read while amplifying a small-amplitude voltage by using the read amplifier, the longer the data appearing on the data bus, the more amplified the data is, and the larger the margin of a data-read timing becomes. Therefore, it is preferable to have as long a pulse length for the data-read operation as possible.

Pulse inputs to the column gates, however, traditionally have a constant pulse length invariably in data-read operations and data-write operations. If the pulse length is shortened so as to be appropriate for data-write operations, data-read operations suffer from an insufficient time period during which the column gates are open. On the other hand, if the pulse length is extended so as to be appropriate for the data read operations, it becomes difficult to secure a sufficient time period for the equalizing operation during the data-write operations. Provided that one clock cycle is sufficiently long, these conflicting requirements do not surface. However, if operation speed is stepped up by shortening a clock cycle, these conflicting requirements become critical. This places a cap on an operation frequency of semiconductor devices, hindering an effort to achieve a high-speed operation.

Accordingly, there is a need for a semiconductor device which can achieve a high-speed operation by resolving conflicting requirements for a data-read-operation period and a data-write-operation period.

SUMMARY OF THE INVENTION

Accordingly, it is a general object of the present invention to provide a semiconductor device which can satisfy the need described above.

It is another and more specific object of the present invention to provide a semiconductor device which can achieve a high-speed operation by resolving conflicting requirements for a data-read-operation period and a data-write-operation period.

In order to achieve the above objects, a semiconductor memory device according to the present invention includes gates which open in a data-write operation and a data-read operation to allow passage of data therethrough, and a control circuit changing an open period of the gates between the data-write operation and the data-read operation.

According to an embodiment of the present invention, the semiconductor memory device described above further includes memory cells and a plurality of sense amplifiers writing the data in and reading the data from the memory cells, wherein the gates comprise column-gate transistors which are selectively turned on to allow the passage of the data, thereby effecting data exchange between at least one of the sense amplifiers and at least one external node of the semiconductor memory device.

In the semiconductor memory device as described above, the control circuit is provided to change a turn-on period of the column gates between data-read operations and data-write operations, so that the conflicting requirements for the turn-on period between a data-read operation and a data-write operation are resolved so as to achieve a high-speed operation employing a high operation frequency.

An equalizing operation needs a long time period in order to bring data-bus lines to the same voltage level in the data-write operations because data signals require a large voltage amplitude in order to effect appropriate data-write operations. In the present invention, a relatively short time period is allocated as the turn-on period of the column gates in the data-write operations, so that the large voltage amplitude can be fully equalized prior to a start of a next cycle.

In data-read operations, data signals need a relatively long time period before they are amplified to a sufficient voltage level since the data signals are gradually amplified. Also, it is preferable to hold the data signals on the data bus for an increased time period because an increasingly large margin can be provided to secure an appropriate timing of read operations for the data signal to be read from the data bus to a next stage. In the present invention, a relatively long time period is provided for the turn-on period of the column gates in the data-read operations, so that the data signal can be held for a sufficiently long time period to insure an appropriate data-read operation.

If the pulse lengths are set to the same length in the data-read operations and the data-write operations, a sufficient time period cannot be secured for either the equalizing Process in the data-write operations or the data-read process in the data-read operations. Since the present invention changes the turn-on period of the column gates between the data-read operations and the data-write operations, however, the present invention makes it possible to use a shorter clock cycle than that used in conventional techniques, thereby achieving high-speed data-read/write operations.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
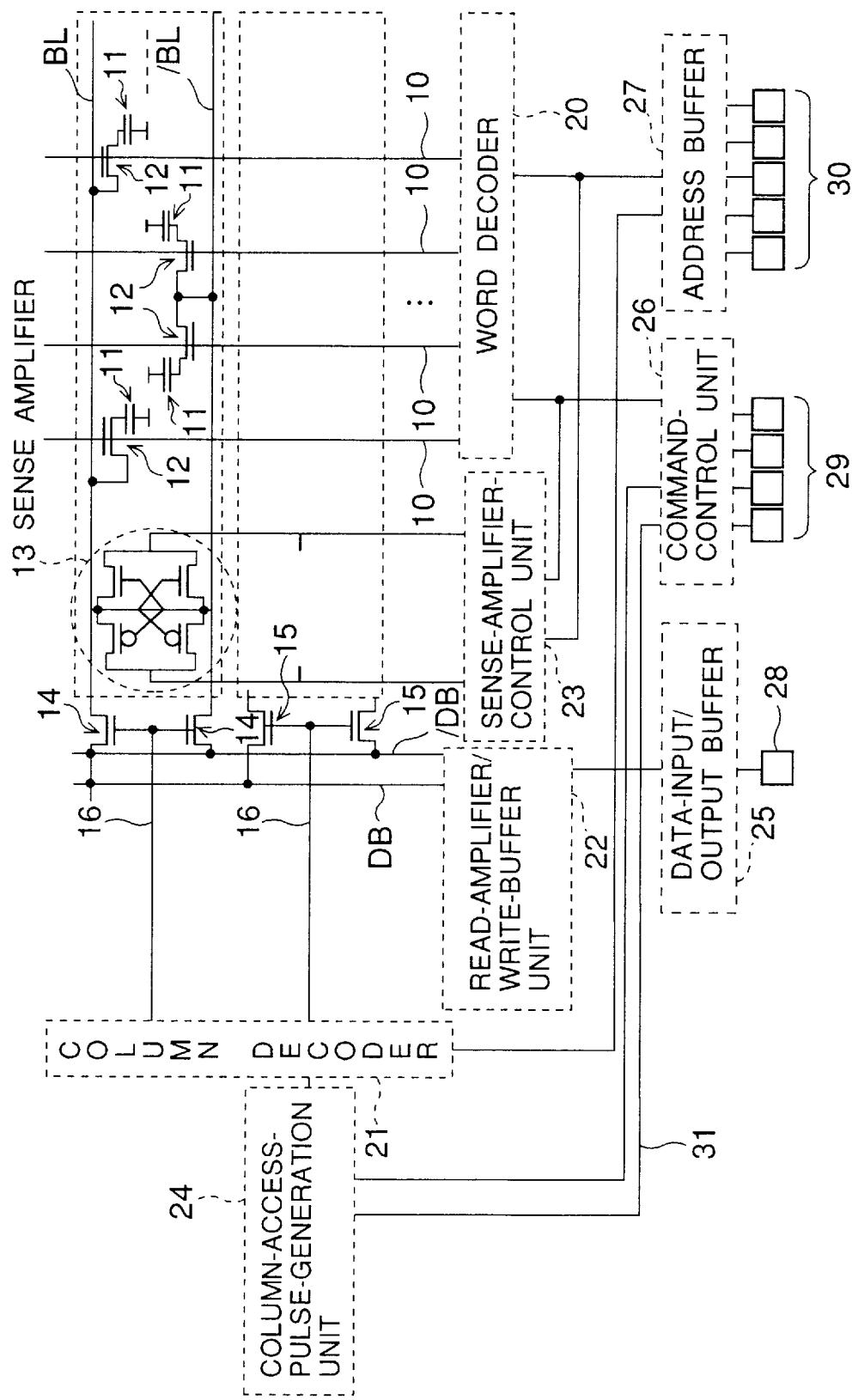
FIG. 1 is an illustrative drawing showing an embodiment of a semiconductor memory device according to the present invention.

FIG. 1 is an illustrative drawing showing an embodiment of a semiconductor device according to the present invention.

A DRAM of FIG. 1 includes a plurality of word-selection lines 10, a plurality of memory cells 11, a plurality of cell transistors 12, sense amplifiers 13, column-gate transistors 14 and 15, a plurality of column-selection lines 16, a word decoder 20, a column decoder 21, a read-amplifier/write-buffer unit 22, a sense-amplifier-control unit 23, a column-access-pulse-generation unit 24, a data-input/output buffer 25, a command-control unit 26, an address buffer 27, a data pad 28, control pads 29, address pads 30, a signal line 31, a pair of bit lines BL and /BL, and a pair of data bus DB and /DB. Here, the symbol "/" before symbols such as BL and DB indicates an inversion signal.

In the DRAM of FIG. 1, the column-access-pulse-generation unit 24 is different from that used in conventional DRAMs. The column-access-pulse-generation unit 24 receives a read/write signal from the command-control unit 26 via the signal line 31, and this read/write signal indicates whether a current operation is a data-read operation or a data-write operation. Upon receiving a column access signal from the command-control unit 26, the column-access-pulse-generation unit 24 generates a pulse signal having different pulse lengths depending on whether the read/write signal indicates a data-read operation or a data-write operation. The generated pulse signal is supplied to the column decoder 21. The column decoder 21 in turn supplies the received pulse signal to one of the column-selection lines 16 so as to turn on selected ones of the column-gate transistors 14 and 15.

In this manner, the column-gate transistors 14 and 15, which are provided for data transfer in data-read/write operations, have different turn-on periods between data-read operations and data-write operations. As a result, a sufficient time period is spared for the equalizing operation in the data-write operations by controlling the column-access-pulse-generation unit 24 to generate a pulse signal of a relatively short pulse length, while a sufficient time period is secured for the data-read operation by controlling the column-access-pulse-generation unit 24 to produce a pulse signal having a relatively long pulse length. A clock cycle thus can be shortened to achieve high-speed data-read/write operations based on a high clock frequency.

Operations of the DRAM of FIG. 1 other than that described above are the same as those of conventional DRAMs.

The above description has made no mention of the precharging operation and the equalizing operation. The precharging operation and the equalizing operation are performed during a period when the pulse signal generated by the column-access-pulse-generation unit 24 is LOW, while the column gates are opened during the period of the pulse signal being HIGH. This configuration is also the same as that of conventional DRAMs.

Operations of the DRAM of FIG. 1 will be described below. In the DRAM of FIG. 1, only one pair of data-bus lines and only one data pad are shown for the sake of clarity of the figure. It is apparent, however, that this DRAM can be provided with a plurality of pairs of data-bus lines and a plurality of data pads.

In the case of data-read operations, address signals are provided to the address pads 30. The address signals are then stored in the address buffer 27, and supplied to the word decoder 20 and the column decoder 21.

The word decoder 20 turns a pair of the word-selection lines 10 selected by the address signals to HIGH, thereby turning a corresponding pair of the cell transistors 12 on. Data of a selected pair of the memory cells 11 is supplied to the bit lines BL and /BL via the turned-on cell transistors 12. The data signal on the bit lines BL and /BL is amplified by the sense amplifiers 13 controlled by the sense-amplifier-control unit 23.

The column decoder 21 receives the address signal from the address buffer 27 as well as the pulse signal from the column-access-pulse-generation unit 24. The column decoder 21 feeds the pulse signal to one of the column-selection lines 16 selected by the address signal. The column-gate transistors 14 or the column-gate transistors 15 corresponding to the selected one of the column-selection lines 16 are turned on, so that the data signal amplified by the sense amplifiers 13 is supplied to the data bus DB and /DB. The data signal on the data bus DB and /DB is read and amplified by the read-amplifier/write-buffer unit 22 before the data-input/output buffer 25 receives the data signal. The data-input/output buffer 25 outputs the data signal via the data pad 28. In this manner, the stored data is extracted from an address indicated by the address signals.

In the data-read operations described above, the pulse length which defines a gate-open period of the column-gate transistors 14 or the column-gate transistors 15 is set by the column-access-pulse-generation unit 24 so as to provide a sufficient time length for amplifying a small voltage in a data-read operation and to provide a sufficient operational margin. Therefore, a clock cycle can be shortened to achieve high-speed data-read operations employing a high clock frequency.

In the case of data-write operations, the data pad 28 and the address pads 30 receives a data signal and address signals, respectively. The data signal is supplied via the data-input/output buffer 25 to the read-amplifier/write-buffer unit 22. The data supplied to the read-amplifier/write-buffer unit 22 appears on the data bus DB and /DB as a voltage difference. The address signals input to the address pads 30 are stored in the address buffer 27, and fed to the word decoder 20 and the column decoder 21.

The column decoder 21 receives a pulse signal from the column-access-pulse-generation unit 24 in addition to the address signal from the address buffer 27. The column decoder 21 feeds the pulse signal to one of the column-selection lines 16 selected by the address signal. The column-gate transistors 14 or the column-gate transistors 15 corresponding to the selected one of the column-selection lines 16 are turned on so that the data signal on the data bus DB and /DB is provided to a sense amplifier 13 to overwrite old data stored in the sense amplifier 13. The data supplied to the sense amplifier 13 then appears on the bit lines BL and /BL as a data signal.

The word decoder 20 turns a pair of the word-selection lines 10 selected by the address signals to HIGH, thereby turning a corresponding pair of the cell transistors 12 on. A selected pair of the memory cells 11 stores the data on the bit lines BL and /BL as electric charges supplied via the turned-on cell transistors 12. In this manner, the input data is stored in an address indicated by the address signals.

In the data-write operations described above, the pulse length which defines a gate-open period of the column-gate transistors 14 or the column-gate transistors 15 is set to a relatively short time period by the column-access-pulse-generation unit 24 so as to leave a sufficient time for the equalizing operation to finish following a data-write operation. Therefore, a clock cycle can be shortened to achieve high-speed data-write operations employing a high clock frequency.

Figure 2A:
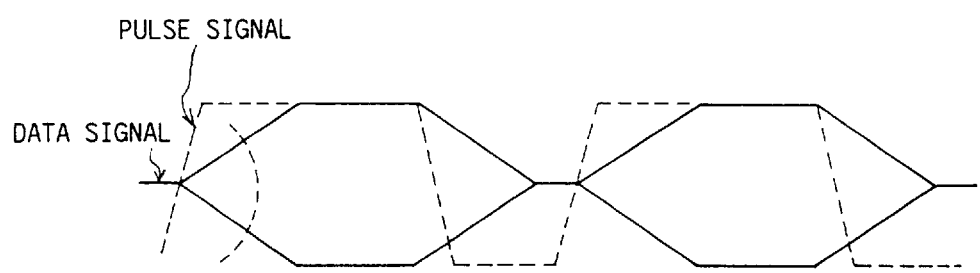
FIGS. 2A and 2B are time charts showing pulse signals generated by the column-access-pulse-generation unit of FIG. 1.
Figure 2B:
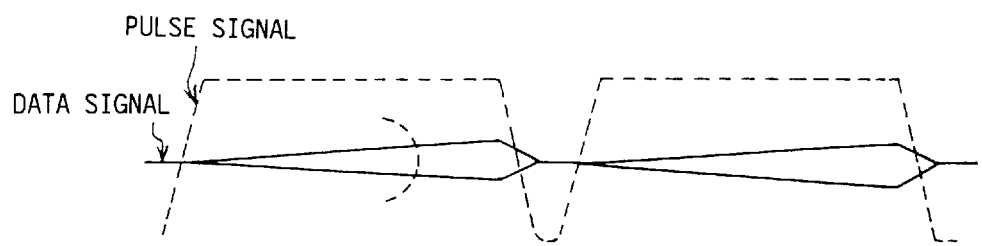

FIGS. 2A and 2B are time charts showing pulse signals generated by the column-access-pulse-generation unit 24 of FIG. 1. FIG. 2A shows a pulse signal generated at a time of data-write operations, and FIG. 2B shows a pulse signal produced at a time of data-read operations. Superimposed on these pulse signals, voltage waveforms of data signals on the data bus DB and /DB are shown in the figures.

As is apparent from a comparison between FIG. 2A and FIG. 2B, the pulse signal for data-read operations has a longer pulse length (defined by a period in which the signal is HIGH) than that for data-write operations despite the same cycle of both pulse signals.

As shown in FIG. 2A, the data signal has a large voltage amplitude in order to effect appropriate data-write operations, so that equalizing the data bus DB and /DB to the same voltage level takes a relatively long time. In the present invention, a pulse signal having a relatively short pulse length is used in data-write operations, so that equalizing is completed before the start of the next cycle despite the large voltage amplitude of the data signal.

As shown in FIG. 2B, the amplitude of the data signal is gradually amplified in data-read operations, so that it takes a relatively long time to amplify the data signal to a sufficient amplitude. Also, when a timing of data transfer from the data bus DB and /DB to a next stage is taken into consideration, it is preferable to hold the data signal for an increased time period because an increasingly sufficient margin is secured for the operation timing. In the present invention, a pulse signal having a relatively long pulse length is used in data-read operations, so that a sufficiently long period is secured for a data-read operation.

If the pulse lengths are set to the same length in data-read operations and data-write operations, a sufficient time period cannot be secured for either an equalizing process in the data-write operations or a data-read process in the data-read operations. By changing the pulse length between the data-read operations and the data-write operations as shown in FIGS. 2A and 2B, however, the present invention makes it possible to use a shorter clock cycle than that used in conventional techniques, thereby achieving high-speed data-read/write operations.

Figure 3:
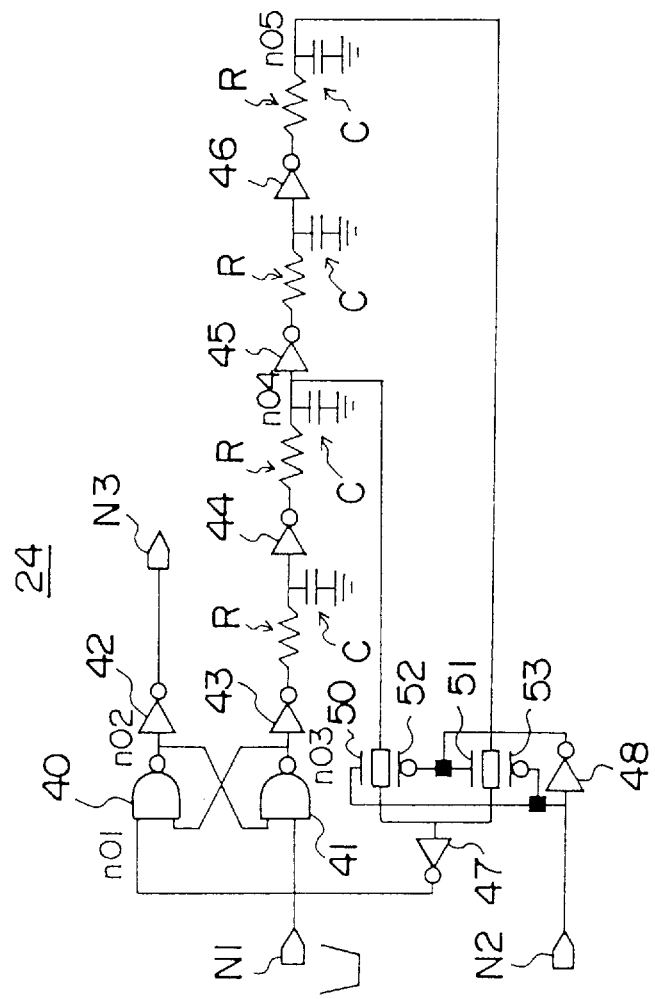
FIG. 3 is a circuit diagram of a first embodiment of the column-access-pulse-generation unit according to the present invention.
Figure 4:
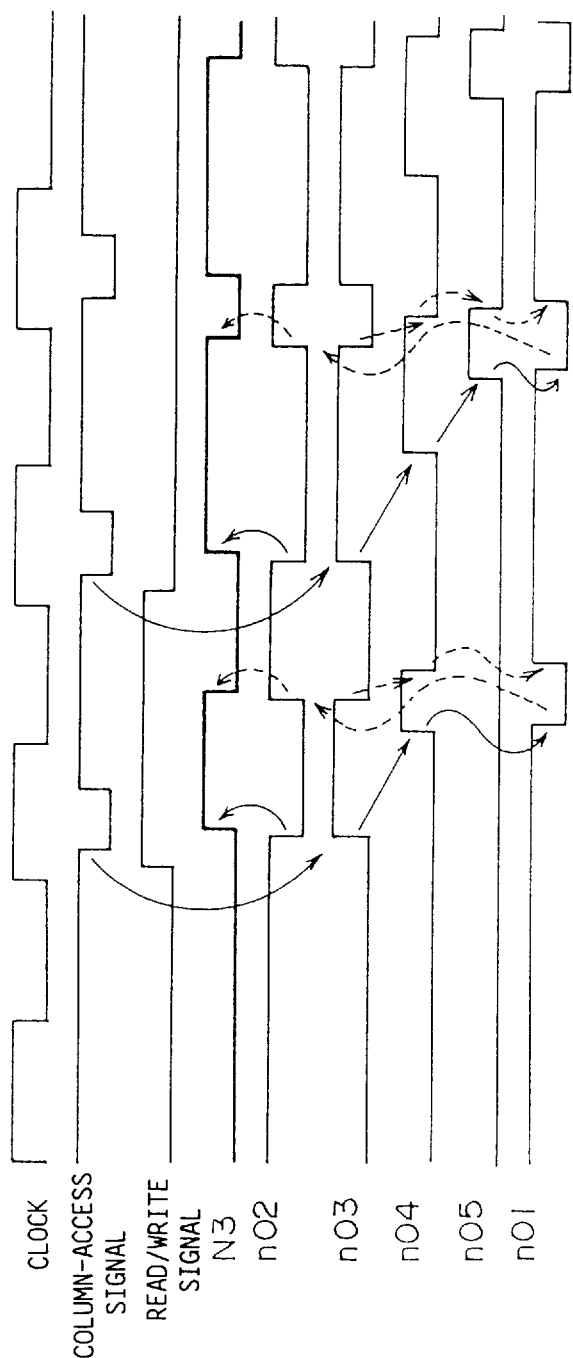
FIGS. 4A through 4I are timing charts for explaining operations of the column-access-pulse-generation unit of FIG. 3.

FIG. 3 is a circuit diagram of a first embodiment of the column-access-pulse-generation unit 24 according to the present invention.

The column-access-pulse-generation unit 24 of FIG. 3 includes NAND circuits 40 and 41, inverters 42 through 48, NMOS transistors 50 and 51, PMOS transistors 52 and 53, and a plurality of pairs of resistors R and capacitors C. The NAND circuits 40 and 41 together form an RS flip-flop, and a pair of elements comprising a resistor R and a capacitor C serves as a delay element.

FIGS. 4A through 4I are timing charts for explaining operations of the column-access-pulse-generation unit 24 of FIG. 3. Operations of the column-access-pulse-generation unit 24 will be described below with reference to FIG. 3 and FIGS. 4A through 4I.

In an initial state, the RS flip-flop comprising the NAND circuits 40 and 41 receives a HIGH signal at an input node N1, and the other input node n01 is also HIGH. Nodes n02 and n03 are HIGH and LOW, respectively. In the initial state, thus, an output node N3 of the column-access-pulse-generation unit 24 produces a LOW signal since the HIGH signal at the node n02 is inverted by the inverter 42.

In this initial state, a LOW pulse is applied to the node N1 as a column-access signal. Since the input nodes N1 and n01 of the RS flip-flop are LOW and HIGH, respectively, the output nodes n02 and n03 of the RS flip-flop become LOW and HIGH, respectively. In response to this change, the output node N3 of the column-access-pulse-generation unit 24 is turned from LOW to HIGH.

Circuit operations after this stage are different between data-read operations and data-write operations.

First, circuit operations in the data-write operations will be described.

In the case of data-write operations, a node N2 receives a HIGH signal as the read/write signal. In this case, the NMOS transistor 50 and the PMOS transistor 52 are turned on, and the NMOS transistor 51 and the PMOS transistor 53 are turned off.

A change from LOW to HIGH at the node n03 propagates through a series of delay elements comprised of the inverters 43 through 46, the resistors R, and the capacitors C. After a signal propagation, a voltage at a node n04 is turned from LOW to HIGH with some delay following the change at the node n03. The change from LOW to HIGH at the node n04 reaches the inverter 47 via the NMOS transistor 50 and the PMOS transistor 52. The node n01 at an output of the inverter 47 changes from HIGH to LOW.

By this time, the column-access signal applied to the node N1 has already been returned to HIGH. Namely, the input nodes N1 and n01 of the RS flip-flop are HIGH and LOW, respectively. In this case, the output nodes n02 and n03 of the RS flip-flop become HIGH and LOW, respectively. In response to this change, the output node N3 of the column-access-pulse-generation unit 24 turns or changes from HIGH to LOW.

In this manner, the column-access-pulse-generation unit 24 in the case of data-write operations generates a pulse signal having a pulse length equal to a time length required by the signal propagation from the node n03 to the node n04.

Next, circuit operations in the data-read operations will be described.

In the case of data-read operations, a node N2 receives a LOW signal as the read/write signal. In this case, the NMOS transistor 50 and the PMOS transistor 52 are turned off, and the NMOS transistor 51 and the PMOS transistor 53 are turned on.

A change from LOW to HIGH at the node n03 propagates through a series of the delay elements comprised of the inverters 43 through 46, the resistors R, and the capacitors C. After a signal propagation, a voltage at a node n05 is turned from LOW to HIGH with some delay following the change at the node n03. The change from LOW to HIGH at the node n05 reaches the inverter 47 via the NMOS transistor 51 and the PMOS transistor 53. The node n01 at the output of the inverter 47 changes from HIGH to LOW.

By this time, the column-access signal applied to the node N1 has already been returned to HIGH. Namely, the input nodes N1 and n01 of the RS flip-flop are HIGH and LOW, respectively. In this case, the output nodes n02 and n03 of the RS flip-flop become HIGH and LOW, respectively. In response to this change, the output node N3 of the column-access-pulse-generation unit 24 is changed from HIGH to LOW.

In this manner, the column-access-pulse-generation unit 24 in the case of data-read operations generates a pulse signal having a pulse length equal to a time length required by the signal propagation from the node n03 to the node n05.

As described above, the column-access-pulse-generation unit 24 of the first embodiment extracts a signal for resetting the RS flip-flop from a series of the delay elements comprised of the inverters, resistors, and capacitors, and changes a position to extract the signal along the series of the delay elements in order to change the pulse length between the data-write operations and the data-read operations.

Figure 5:
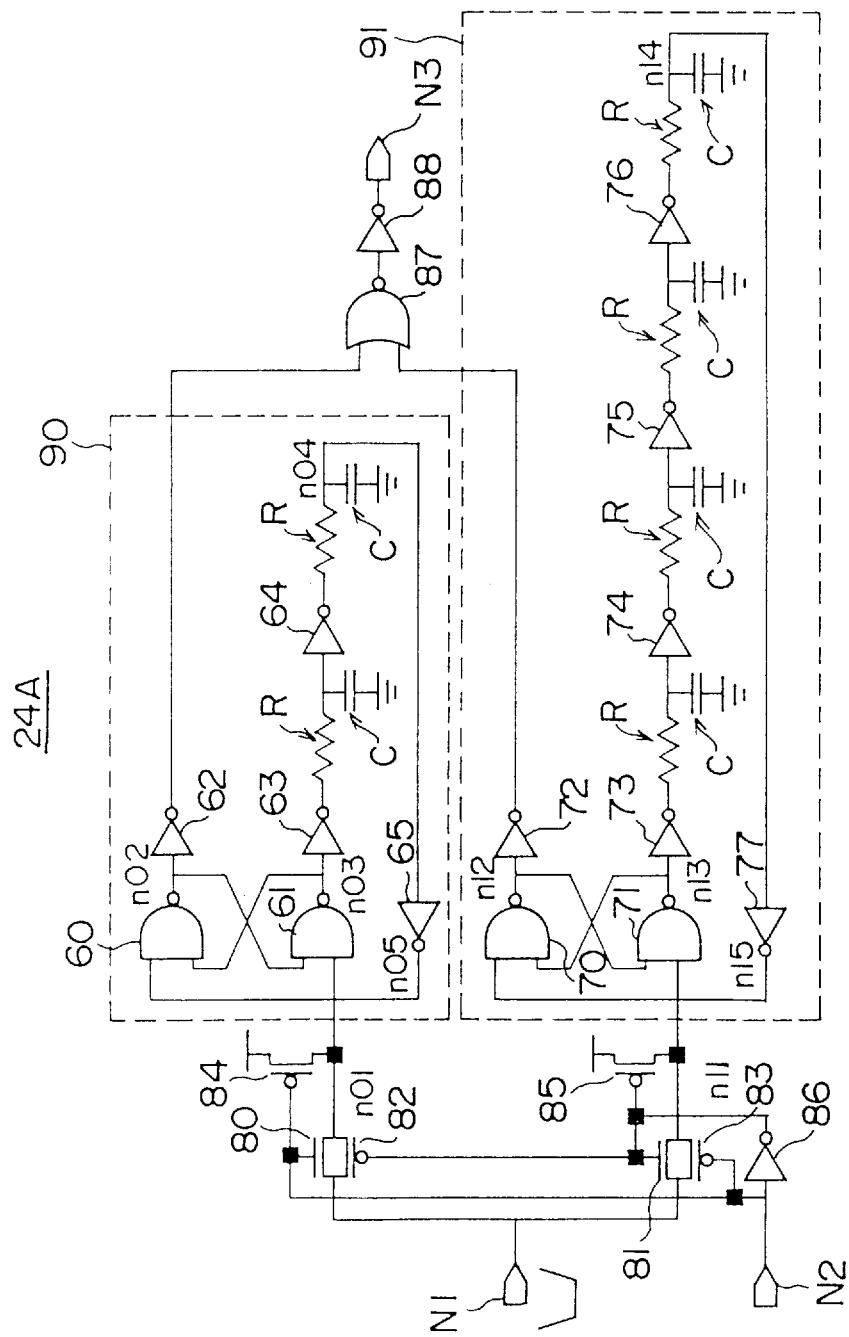
FIG. 5 is a circuit diagram of a second embodiment of the column-access-pulse-generation unit according to the present invention.

FIG. 5 is a circuit diagram of a second embodiment of the column-access-pulse-generation unit 24 according to the present invention.

The column-access-pulse-generation unit 24A of FIG. 5 includes a write-pulse-generation unit 90, a read-pulse-generation unit 91, NMOS transistors 80 and 81, PMOS transistors 82 through 85, an inverter 86, a NOR circuit 87, and an inverter 88.

The write-pulse-generation unit 90 includes NAND circuits 60 and 61, inverters 62 through 65, and a plurality of pairs of resistors R and capacitors C. The NAND circuits 60 and 61 together make up an RS flip-flop, and a delay element is formed by a pair of elements comprising a resistor R and a capacitor C.

The read-pulse-generation unit 91 includes NAND circuits 70 and 71, inverters 72 through 77, and a plurality of pairs of resistors R and capacitors C. The NAND circuits 70 and 71 together make up an RS flip-flop, and a delay element is formed by a pair of elements comprising a resistor R and a capacitor C.

In the column-access-pulse-generation unit 24A of FIG. 5, either the write-pulse-generation unit 90 or the read-pulse-generation unit 91 selectively operates depending on whether a current operation is a data-read operation or a data-write operation. A circuit comprised of the NMOS transistors 80 and 81, the PMOS transistors 82 through 85, and the inverter 86 supplies a column-access signal received at a node N1 to either the write-pulse-generation unit 90 or the read-pulse-generation unit 91, depending on whether a read/write signal at a node N2 indicates a data-write operation or a data-read operation.

In the case of data-write operations, the read/write signal received at the node N2 is HIGH. In this case, the NMOS transistor 80 and the PMOS transistor 82 are turned on. Since the PMOS transistor 84 is turned off, the read/write signal is supplied to the write-pulse-generation unit 90. Since the NMOS transistor 81 and the PMOS transistor 83 are turned off and the PMOS transistor 85 is turned on, the read-pulse-generation unit 91 receives a HIGH signal all the time. In these conditions, the write-pulse-generation unit 90 is in operation, while the read-pulse-generation unit 91 is inactive.

In the case of data-read operations, the read/write signal received at the node N2 is LOW. In this case, the NMOS transistor 81 and the PMOS transistor 83 are turned on. Since the PMOS transistor 85 is turned off, the read/write signal is supplied to the read-pulse-generation unit 91. Since the NMOS transistor 80 and the PMOS transistor 82 are turned off and the PMOS transistor 84 is turned on, the write-pulse-generation unit 90 receives a HIGH signal at all the time. In these conditions, the read-pulse-generation unit 91 is in operation, while the write-pulse-generation unit 90 is inactive.

Figure 6:
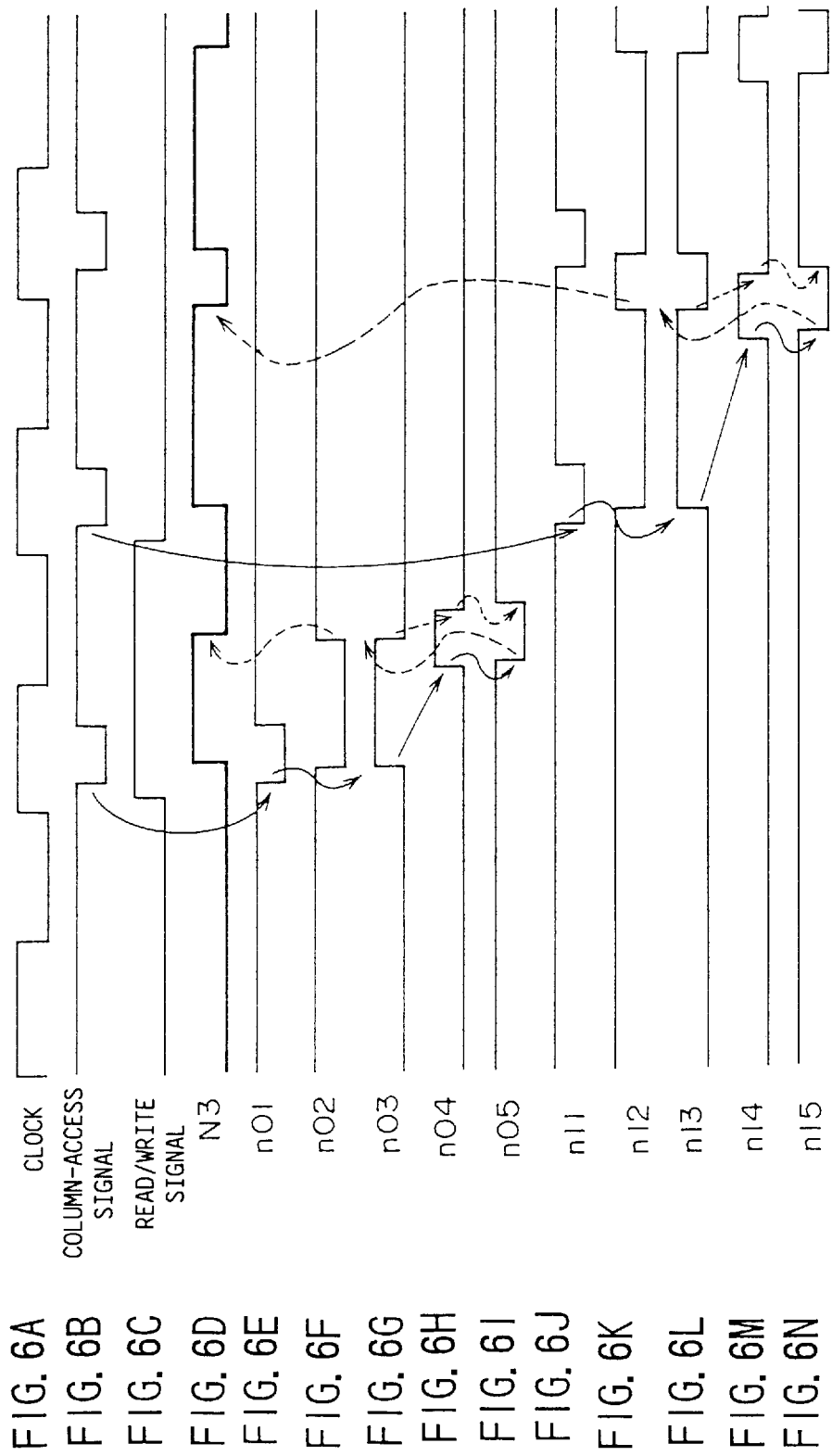
FIGS. 6A through 6N are timing charts for explaining operations of the column-access-pulse-generation unit of FIG. 5.

FIGS. 6A through 6N are timing charts for explaining operations of the column-access-pulse-generation unit 24A of FIG. 5. Operations of the column-access-pulse-generation unit 24A will be described below with reference to FIG. 5 and FIGS. 6A through 6N.

First, operations of the write-pulse-generation unit 90 in the case of data-write operations will be described.

In an initial state, the RS flip-flop comprising the NAND circuits 60 and 61 receives a HIGH signal at an input node n01, and the other input node n05 is also HIGH. Nodes n02 and n03 are HIGH and LOW, respectively. In the initial state, thus, an output of the write-pulse-generation unit 90 produces a LOW signal since the HIGH signal at the node n02 is inverted by the inverter 62.

In this initial state, a LOW pulse is applied to the node n01 as the column-access signal. Since the input nodes n01 and n05 of the RS flip-flop are now LOW and HIGH, respectively, the output nodes n02 and n03 of the RS flip-flop become LOW and HIGH, respectively. In response to this change, the output of the write-pulse-generation unit 90 is changed from LOW to HIGH.

The change from LOW to HIGH at the node n03 propagates through a series of delay elements comprised of the inverters 63 and 64, the resistors R, and the capacitors C. After a signal propagation, a voltage at a node n04 is turned from LOW to HIGH with some delay following the change at the node n03. The change from LOW to HIGH at the node n04 is inverted by the inverter 65, so that the node n05 at an output of the inverter 65 changes from HIGH to LOW.

By this time, the column-access signal applied to the node n01 has been already returned to HIGH. Namely, the input nodes n01 and n05 of the RS flip-flop are HIGH and LOW, respectively. In this case, the output nodes n02 and n03 of the RS flip-flop become HIGH and LOW, respectively. In response to this change, the output of the write-pulse-generation unit 90 is changed from HIGH to LOW.

Next, operations of the read-pulse-generation unit 91 in the case of data-read operations will be described.

In an initial state, the RS flip-flop comprising the NAND circuits 70 and 71 receives a HIGH signal at an input node n11, and the other input node n15 is also HIGH. Nodes n12 and n13 are HIGH and LOW, respectively. In the initial state, thus, an output of the read-pulse-generation unit 91 produces a LOW signal since the HIGH signal at the node n12 is inverted by the inverter 72.

In this initial state, a LOW pulse is applied to the node n11 as the column-access signal. Since the input nodes n11 and n15 of the RS flip-flop are now LOW and HIGH, respectively, the output nodes n12 and n13 of the RS flip-flop become LOW and HIGH, respectively. In response to this change, the output of the read-pulse-generation unit 91 is changed from LOW to HIGH.

The change from LOW to HIGH at the node n13 propagates through a series of delay elements comprised of the inverters 73 and 76, the resistors R, and the capacitors C. After a signal propagation, a voltage at a node n14 is turned from LOW to HIGH with some delay following the change at the node n13. The change from LOW to HIGH at the node n14 is inverted by the inverter 77, so that the node n15 at an output of the inverter 77 changes from HIGH to LOW.

By this time, the column-access signal applied to the node nil has been already returned to HIGH. Namely, the input nodes nil and n15 of the RS flip-flop are HIGH and LOW, respectively. In this case, the output nodes n12 and n13 of the RS flip-flop become HIGH and LOW, respectively. In response to this change, the output of the read-pulse-generation unit 91 is changed from HIGH to LOW.

The outputs of the write-pulse-generation unit 90 and the read-pulse-generation unit 91 are subjected to an OR-logic operation by the NOR circuit 87 and the inverter 88. As a result, an output node N3 of the column-access-pulse-generation unit 24A receives an output signal of either the write-pulse-generation unit 90 or the read-pulse-generation unit 91 whichever is in operation.

In this manner, the column-access-pulse-generation unit 24A in the case of data-write operations generates a pulse signal having a pulse length equal to a time length required by the signal propagation from the node n03 to the node n04. In the case of data-read operation, the column-access-pulse-generation unit 24A operations generates a pulse signal which has a pulse length equal to a time length required by the signal propagation from the node n13 to the node n14.

As described above, the column-access-pulse-generation unit 24A of the second embodiment is provided with the write-pulse-generation unit 90 and the read-pulse-generation unit 91 for generating pulse signals having different pulse lengths, and selectively operates either one of the units to change a pulse length between data-read operations and data-write operations.

The pulse signal generated by the circuit of FIG. 3 or FIG. 5 as described above is supplied to the column decoder 21 of FIG. 1.

Figure 7:
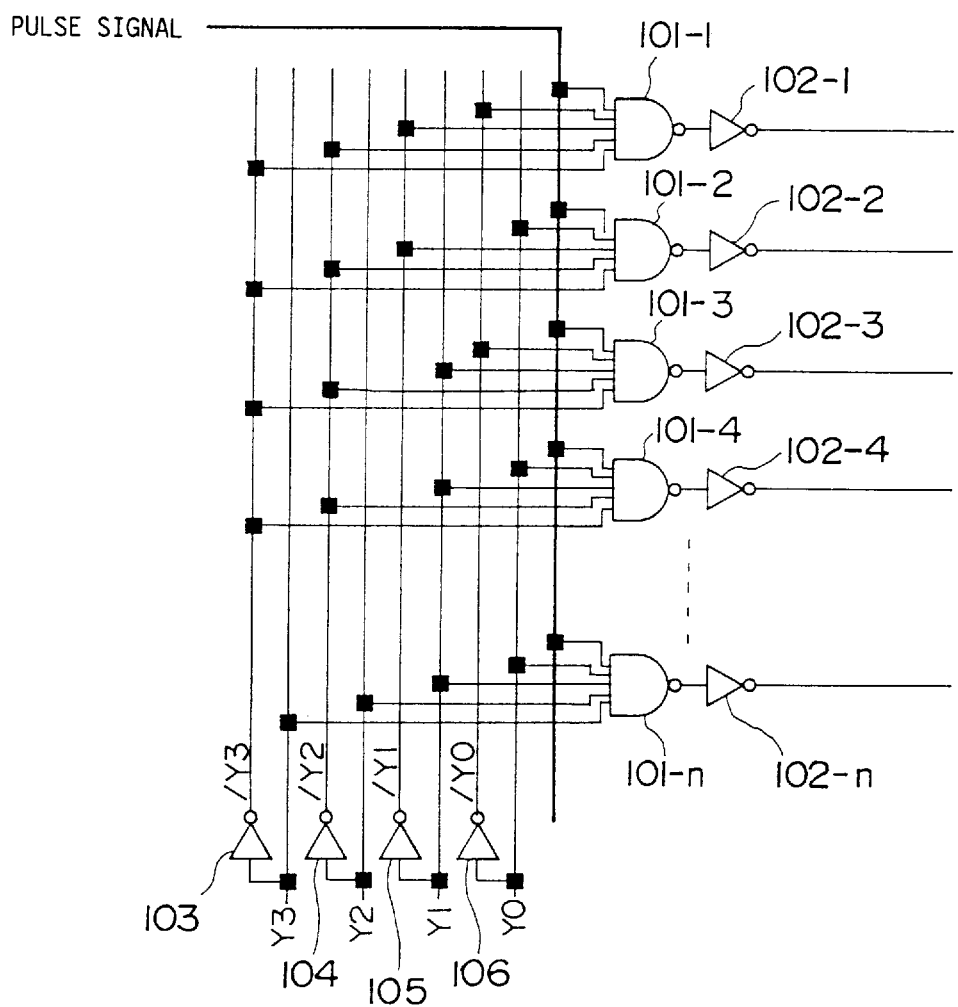
FIG. 7 is a circuit diagram of an example of the column decoder of FIG. 1.

FIG. 7 is a circuit diagram of an example of the column decoder 21. In the column decoder 21 of FIG. 7, the pulse length of a supplied pulse signal varies between at the time of data-write operations and at the time of data-read operations.

The column decoder 21 of FIG. 7 includes NAND circuits 101-1 through 101-n, inverters 102-1 through 102-n, and inverters 103 through 106. The inverters 103 through 106 receive address signals Y3 through Y0, respectively, and invert these address signals. A proper combination of the address signals Y0 through Y3 and inverted signals thereof is input to each of the NAND circuits 101-1 through 101-n. Each of the NAND circuits 101-1 through 101-n further receives a pulse signal from the column-access-pulse-generation unit 24 (or the column-access-pulse-generation unit 24A).

The NAND circuit 101-2, for example, is selected when the address signals (Y3, Y2, Y1, Y0) are (0, 0, 0, 1), respectively. The selected NAND circuit 101-2 passes the pulse signal at the other input thereof to the output thereof, thereby supplying the pulse signal to a column-gate transistor via one of the column-selection lines 16 as shown in FIG. 1.

Figure 8A:
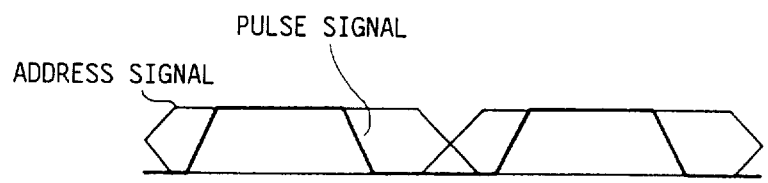
FIG. 8A is a timing chart showing timing relations between address signals and a pulse signal.
Figure 8B:
FIG. 8B is a timing chart showing a timing of a pulse signal output from the column decoder.

FIG. 8A is a timing chart showing timing relations between the address signals and the pulse signal. FIG. 8B is a timing chart showing a timing of a pulse signal output from the column decoder 21. As shown in FIG. 8A, the pulse signal is generated by the column-access-pulse-generation unit 24 such that it extends only within a period of effective address signals. Since the pulse signal becomes HIGH only during the period of effective address signals in any one of data-read operations and data-write operations, the pulse signal is supplied to one of the column-selection lines 16 without any change to the pulse length thereof, as shown in FIG. 8B.

Figure 9:
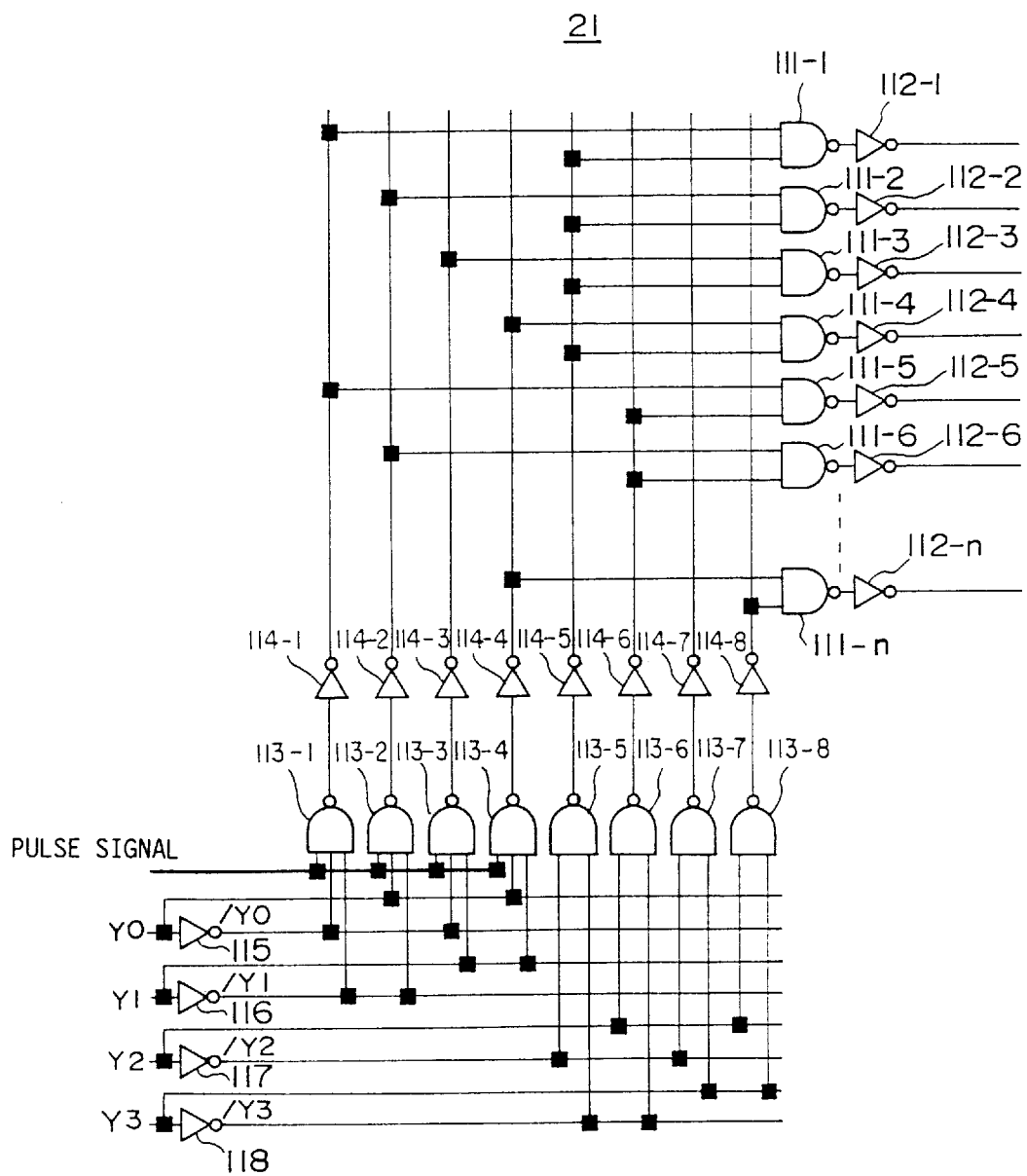
FIG. 9 is a circuit diagram of another example of the column decoder.

FIG. 9 is a circuit diagram of another example of the column decoder 21. In the column decoder 21 of FIG. 9, the pulse length of a supplied pulse signal varies between at the time of data-write operations and at the time of data-read operations.

The column decoder 21 of FIG. 9 includes NAND circuits 111-1 through 111-n, inverters 112-1 through 112-n, NAND circuits 113-1 through 113-8, inverters 114-1 through 114-8, and inverters 115 through 118. The inverters 115 through 118 receive address signals Y0 through Y3, respectively, and invert these address signals.

A proper combination of the address signals Y0 through Y3 and inverted signals thereof is input to each of the NAND circuits 113-1 through 113-8. In the configuration of FIG. 9, two bits Y0 and Y1 of the address signals are decoded to select one of the NAND circuits 113-1 through 113-4, and the remaining two bits Y2 and Y3 are decoded to select one of the NAND circuits 113-5 through 113-8.

Each of the NAND circuits 113-1 through 113-4 further receives a pulse signal from the column-access-pulse-generation unit 24 (or the column-access-pulse-generation unit 24A). During a period when the pulse signal maintains a HIGH level, therefore, a selected one of the NAND circuits 113-1 through 113-4 outputs a pulse signal (an inverse of the pulse signal to be exact).

Outputs of the NAND circuits 113-1 through 113-8 are inverted by the inverters 114-1 through 114-8, respectively. Proper combinations of the outputs of the inverters 114-1 through 114-8 are supplied to the NAND circuits 111-1 through 111-n. These proper combinations allow one of the NAND circuits 111-1 through 111-n to be selected based on decoding results of the address signals Y0 through Y3. An output of the selected one of the NAND circuits 111-1 through 111-n becomes an inverse of the pulse signal input, which is further inverted by one of the inverter circuits 112-1 through 112-n to be supplied to one of the column-selection lines 16 (FIG. 1) as a pulse signal.

In the circuit of FIG. 9, the pulse signal generated by the column-access-pulse-generation unit 24 falls within the period of effective address signals as shown in FIG. 8A, as it does in the circuit of FIG. 7. Since the pulse signal becomes HIGH only during the period of effective address signals in any one of data-read operations and data-write operations, the pulse signal is supplied to one of the column-selection lines 16 without any change to the pulse length thereof, as shown in FIG. 8B.

As described above, according to the present invention, a control means is provided to change a turn-on period of the column gates between data-read operations and data-write operations, so that the conflicting requirements for the turn-on period between a data-read operation and a data-write operation are resolved so as to achieve a high-speed operation employing a high operation frequency.

Namely, an equalizing operation needs a long time period in order to bring data-bus lines to the same voltage level in the data-write operations because data signals require a large voltage amplitude in order to effect appropriate data-write operations. In the present invention, a relatively short time period is allocated as the turn-on period of the column gates in the data-write operations, so that the large voltage amplitude can be fully equalized prior to a start of a next cycle.

In data-read operations, data signals need a relatively long time period before they are amplified to a sufficient voltage level since the data signals are gradually amplified. Also, it is preferable to hold the data signals on the data bus for an increased time period because an increasingly large margin can be provided to secure an appropriate timing of read operations for the data signal to be read from the data bus to a next or another stage. In the present invention, a relatively long time period is provided for the turn-on period of the column gates in the data-read operations, so that the data signal can be hold for a sufficiently long time period to insure an appropriate data-read operation.

If the pulse lengths are set to the same length in the data-read operations and the data-write operations, a sufficient time period cannot be secured for either an equalizing process in the data-write operations or a data-read process in the data-read operations. Since the present invention changes the turn-on period of the column gates between the data-read operations and the data-write operations, however, the present invention makes it possible to use a shorter clock cycle than that used in conventional techniques, thereby achieving high-speed data-read/write operations.

Further, the present invention is not limited to these embodiments, but variations and modifications may be made without departing from the scope of the present invention.

What is claimed is:

1. A semiconductor memory device comprising:
   column-gate transistors which open in a data-write operation and a data-read operation to allow a passage of data therethrough; and
   a control circuit controlling an open period of said column-gate transistors as a varying-length portion of a predetermined clock cycle such that said open period in said data-write operation is different from that in said data-read operation.

2. The semiconductor memory device as claimed in claim 1, further comprising:
   memory cells; and
   a plurality of sense amplifiers writing said data in and reading said data from said memory cells,
   wherein said column-gate transistors are selectively turned on to allow said passage of said data, thereby effecting data exchange between at least one of said sense amplifiers and at least one external node of said semiconductor memory device.

3. The semiconductor memory device as claimed in claim 2, wherein said control circuit generates a pulse signal supplied to gate inputs of said column-gate transistors, said control circuit further comprising a pulse generation circuit which changes a pulse length of said pulse signal between said data-write operation and said data-read operation.

4. The semiconductor memory device as claimed in claim 3, wherein said pulse generation circuit comprises means for controlling said pulse length such that said pulse length is shorter in said data-write operation than in said data-read operation.

5. The semiconductor memory device as claimed in claim 3, further comprising a data bus connected to said sense amplifiers via said column-gate transistors, wherein a precharging operation and an equalizing operation are carried out during a period other than said open period in which said column-gate transistors are opened by said pulse signal.

6. The semiconductor memory device as claimed in claim 3, wherein said pulse generation circuit comprises:
   a latch which holds said pulse signal; and
   a reset circuit resetting said latch at different timings between said data-write operation and said data-read operation.

7. The semiconductor memory device as claimed in claim 6, wherein said reset circuit comprises:
   a delay circuit which receives an output signal of said latch and delays said output signal to create a delayed signal; and
   a circuit which extracts said delayed signal from said delay circuit based on an indication signal such that said delayed signal has different delay times depending on whether said indication signal indicates said data-write operation or said data-read operation, wherein said delayed signal is used for resetting said latch.

8. The semiconductor memory device as claimed in claim 3, wherein said pulse generation circuit comprises:
a first latch which holds said pulse signal;
a first reset circuit which resets said first latch at a predetermined first timing;
a second latch which holds said pulse signal;
a second reset circuit which resets said second latch at a predetermined second timing; and
means for operating either said first latch and said first reset circuit or said second latch and said second reset circuit depending on an indication signal indicating one of said data-write operation and said data-read operation.

9. The semiconductor memory device as claimed in claim 8, wherein each of said first reset circuit and said second reset circuit comprises a delay circuit which receives an output signal from a corresponding one of said first latch and said second latch and delays said output signal to create a delayed signal, said delayed signal being used for resetting said corresponding one of said first latch and said second latch.

10. A method of exchanging data between memory cells and external nodes via column-gate transistors in a semiconductor memory device, said method comprising the steps of:
turning on said column-gate transistors for a first predetermined period accounting for a first-length portion of a predetermined clock cycle in a data-read operation; and
turning on said column-gate transistors for a second predetermined period accounting for a second-length portion of said predetermined clock cycle in a data-write operation.

11. The method as claimed in claim 10, wherein said first predetermined period is longer than said second predetermined period.

12. The method as claimed in claim 10, further comprising a step of performing a precharging operation and an equalizing operation during a period other than said first predetermined period and said second predetermined period.

* * * * *